US009157941B2

(12) United States Patent
Lin

(10) Patent No.: US 9,157,941 B2
(45) Date of Patent: Oct. 13, 2015

(54) ELECTRIC POWER INFORMATION DISPLAY RECEPTACLE MODULE

(75) Inventor: Tsung-Chih Lin, Taipei Hsien (TW)

(73) Assignee: Powertech Industrial Co., Ltd., Taipei Hsien (TW)

(*) Notice: Subject to any disclaimer, the term of this patent is extended or adjusted under 35 U.S.C. 154(b) by 511 days.

(21) Appl. No.: 13/005,022

(22) Filed: Jan. 12, 2011

(65) Prior Publication Data
US 2012/0086437 A1 Apr. 12, 2012

(30) Foreign Application Priority Data

Oct. 11, 2010 (TW) .............................. 99134637 A
Nov. 24, 2010 (TW) .............................. 99140653 A

(51) Int. Cl.
*G01R 31/04* (2006.01)
*G01R 22/10* (2006.01)
*H01R 13/66* (2006.01)
(Continued)

(52) U.S. Cl.
CPC .............. *G01R 22/10* (2013.01); *H01R 13/665* (2013.01); *H01R 31/065* (2013.01); *H01R 2103/00* (2013.01)

(58) Field of Classification Search
CPC ..... G01R 22/10; H01R 31/065; H01R 13/665
USPC ................. 324/156, 538; 307/11, 38; 345/156
See application file for complete search history.

(56) References Cited

U.S. PATENT DOCUMENTS 3,820,110 A * 6/1974 Henrich et al. ................. 341/15
4,009,477 A * 2/1977 Rozylowicz .................. 324/156
(Continued)

FOREIGN PATENT DOCUMENTS

CN 2444271 Y 8/2001
TW I242317 B 10/2005
(Continued)

OTHER PUBLICATIONS

Communication From the Taiwan Patent Office Regarding a Counterpart Foreign Application Dated Jun. 6, 2013(Taiwan Year 102).
(Continued)

*Primary Examiner* — Jermele M Hollington
*Assistant Examiner* — Demetrius Pretlow
(74) *Attorney, Agent, or Firm* — Rosenberg, Klein & Lee

(57) ABSTRACT

A detachable electric power information display receptacle module includes an outlet apparatus and an electric power information display apparatus. The outlet apparatus is detachably connected to the electric power information display apparatus and has a power output interface and a power input interface. When an electrical device is connected to the outlet apparatus, the outlet apparatus detects the power consumption of the electrical device. The electric power information display apparatus receives the power consumption from a signal transmission line and displays electric power information. When the electric power information display apparatus is combined with the outlet apparatus, the detachable electric power information display receptacle module is performed as a portable electronic meter. When the electric power information display apparatus is separated from the outlet apparatus, the electric power information display apparatus may be placed in a proper position for user to review the electric power information conveniently.

16 Claims, 9 Drawing Sheets

(51) Int. Cl.
*H01R 31/06* (2006.01)
*H01R 103/00* (2006.01)

(56) References Cited

U.S. PATENT DOCUMENTS

| | | | | |
|---|---|---|---|---|
| 5,661,871 | A * | 9/1997 | Scorsiroli | 15/250.452 |
| 5,811,966 | A * | 9/1998 | Lee | 324/157 |
| 6,095,850 | A * | 8/2000 | Liu | 439/488 |
| 7,275,427 | B1 * | 10/2007 | Martin | 73/146 |
| 7,663,866 | B2 | 2/2010 | Lee et al. | |
| 7,866,772 | B1 * | 1/2011 | Chen | 312/334.9 |
| 7,930,118 | B2 * | 4/2011 | Vinden et al. | 702/64 |
| 8,115,476 | B1 * | 2/2012 | Czarnecki et al. | 324/142 |
| 8,165,832 | B1 * | 4/2012 | Low et al. | 702/60 |
| 8,405,380 | B2 * | 3/2013 | Marzynski et al. | 324/114 |
| 2005/0047030 | A1 | 3/2005 | Lee | |
| 2005/0101193 | A1 * | 5/2005 | Godard | 439/652 |
| 2006/0036380 | A1 * | 2/2006 | Lee et al. | 702/60 |
| 2006/0165316 | A1 * | 7/2006 | Cheung | 383/63 |
| 2006/0255082 | A1 * | 11/2006 | Tsai | 224/403 |
| 2008/0084216 | A1 * | 4/2008 | Sanderford et al. | 324/512 |
| 2009/0079416 | A1 * | 3/2009 | Vinden et al. | 324/103 R |
| 2009/0230950 | A1 * | 9/2009 | Czarnecki | 324/142 |
| 2010/0198751 | A1 * | 8/2010 | Jacobus | 705/412 |
| 2011/0187557 | A1 * | 8/2011 | Dietzler | 340/870.16 |

FOREIGN PATENT DOCUMENTS

| | | |
|---|---|---|
| TW | M348951 U | 1/2009 |
| TW | M350890 U | 2/2009 |
| TW | M359138 U1 | 6/2009 |
| TW | 200935680 A | 8/2009 |

OTHER PUBLICATIONS

Communication From the Chinese Patent Office Regarding a Counterpart Foreign Application Dated Jun. 27, 2013.

* cited by examiner

ELECTRIC POWER INFORMATION DISPLAY RECEPTACLE MODULE

BACKGROUND OF THE INVENTION

1. Field of the Invention

The present invention relates to an outlet apparatus, in particular, to an electric power information display receptacle module.

2. Description of Related Art

The conventional outlet apparatus with electric power information display whose display is usually fixed on the casing of itself provides users to look over the statues of power consumption of the electrical device plugged in the outlet apparatus through the display.

But for cooperating with indoor wiring and, keep environment neat and esthetic, position of the outlet apparatus might disposed on the back of the electrical device or disposed under the desk, users may need to move the electrical device or squat to under of the desk to look over the status of the electricity consumption displayed on the outlet apparatus. So, if the casing of the outlet apparatus and the display could be separate and union quickly, then it is more convenient to use the outlet apparatus with electric power information display.

SUMMARY OF THE INVENTION

The object of the present invention is to offer an electric power information display receptacle module, and the receptacle module has a detachable connection structure, in order to help users easily separate or union the electric power information display apparatus and the outlet apparatus according to the actual need.

In order to achieve the aforementioned objects, according to an embodiment of the present invention, an electric power information display receptacle module is offered, the electric power information display receptacle module includes an outlet apparatus, an electric power information display apparatus and a signal transmission line. The said outlet apparatus includes a casing, a power input interface, a power output interface, a power detecting circuit, and a first connector. The power input interface is disposed on the casing, and the power input interface is used to receive a power. The power output interface is disposed on the casing, and the power output interface is used to output electric power. The detecting circuit is installed in the casing, the electric detecting circuit is coupled to the power input interface and the power output interface, and the power detecting circuit is configured to detect the electric power which pass through the power input interface and the power output interface. The detecting circuit is configured to obtain an electric power signal according to an outcome of detecting. The first connector is disposed on the casing and has a first terminal and a second terminal. The first terminal of the signal transmission line is coupled to the power detecting circuit. The said electric power information display apparatus includes a body, a display unit, a signal processing circuit and a second connector. The display unit is disposed on the body. The signal processing circuit is coupled to the display unit and the second terminal of the signal transmission line. The signal processing circuit receives the electric power signal through the signal transmission line, and controls the display unit to display an electric power information according to the electric power signal. The second connector is disposed on the body. The electric power information display apparatus is detachably connected to the first connector of the outlet apparatus through the second connector.

According to another embodiment of the present invention, an electric power information display receptacle module includes an outlet apparatus and an electric power information display apparatus. The said outlet apparatus is configured to allow for a plug of an electrical device to be plugged. The outlet apparatus detects the power consumption of the electrical device, and outputs the electric power signal according to the detection outcome. The said electric power information display apparatus is coupled to the outlet apparatus through the signal transmission line. The electric power information display apparatus is configured to operate on the electric power signal, and displays the electric power information according to the electric power signal. The electric power information includes an electric quantity, an electricity consumption, an electricity expense and amount of carbon dioxide emission. The outlet apparatus and the electric power information display apparatus are disposed with a convex strip and a trench respectively. The convex strip is engaged to the trench slidingly.

According to another embodiment of the present invention, an electric power information display receptacle module includes an outlet apparatus and an electric power information display apparatus. The said outlet apparatus is configured to allow for a plug of the electrical device to be plugged. The outlet apparatus detects power consumption of the electrical device, and outputs the electric power signal according to the detection outcome. The said electric power information display apparatus is coupled to the outlet apparatus through the signal transmission line The electric power information display apparatus is configured to operate on the electric power signal, and displays the electric power information according to the electric power signal. The electric power information includes an electric quantity, an electricity consumption, an electricity expense and amount of carbon dioxide emission. The outlet apparatus and the electric power information display apparatus are disposed with a protrusion part and a containing part separately. The protrusion part is engaged to the containing part detachably.

According to another embodiment of the present invention, an electric power information display receptacle module includes an outlet apparatus, a signal transmission line and an electric power information display apparatus. The outlet apparatus has an extension cable socket. The said outlet apparatus includes a casing, a power line, a power input interface, a power output interface, a power detecting circuit, and a first connector. The power line extends from inside of the casing to outside of the casing. The power input interface is coupled to the power line, and the power input interface is used to receive electric power. The power output interface is disposed on the casing for outputting electric power. The power detecting circuit is installed in the casing. The power detecting circuit is coupled to the power output interface, and coupled to the power input interface through the power line. The power detecting circuit is used to detect the electric power passing through the power input interface and the power output interface, and to obtain an power signal according to an outcome of detecting the electric power. The first connector is disposed on the casing. The signal transmission line has a first terminal and a second terminal. The first terminal of the signal transmission line is coupled to the power detecting circuit. The said electric power information display apparatus includes a body, a display unit, a signal processing circuit and a second connector. The display unit is disposed on the body. The signal processing circuit is coupled to the display unit and the second terminal of the signal transmission The signal processing circuit receives the electric power signal through the signal transmission line. After operating on the electric power signal by the signal processing circuit, the signal processing circuit controls the display unit to display an electric power information according to the electric power signal. The second connector is disposed on the body, and the electric power information display apparatus is detachably connected to the first connector of the outlet apparatus through the second connector.

Particularly, the outlet apparatus and the electric power information display apparatus may be connected quickly, regarding electric power information display receptacle module as a portable meter, and facilitate users carrying and gauging at any time. The outlet apparatus and the electric power information display apparatus may also be separated quickly. Users may put the electric power information display apparatus in the place apt to observe and operate, so as to help users review the electric power information and operation. Therefore, the electric power information display receptacle module has function of flexible use.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

An Embodiment of the Present Invention

Figure 1:
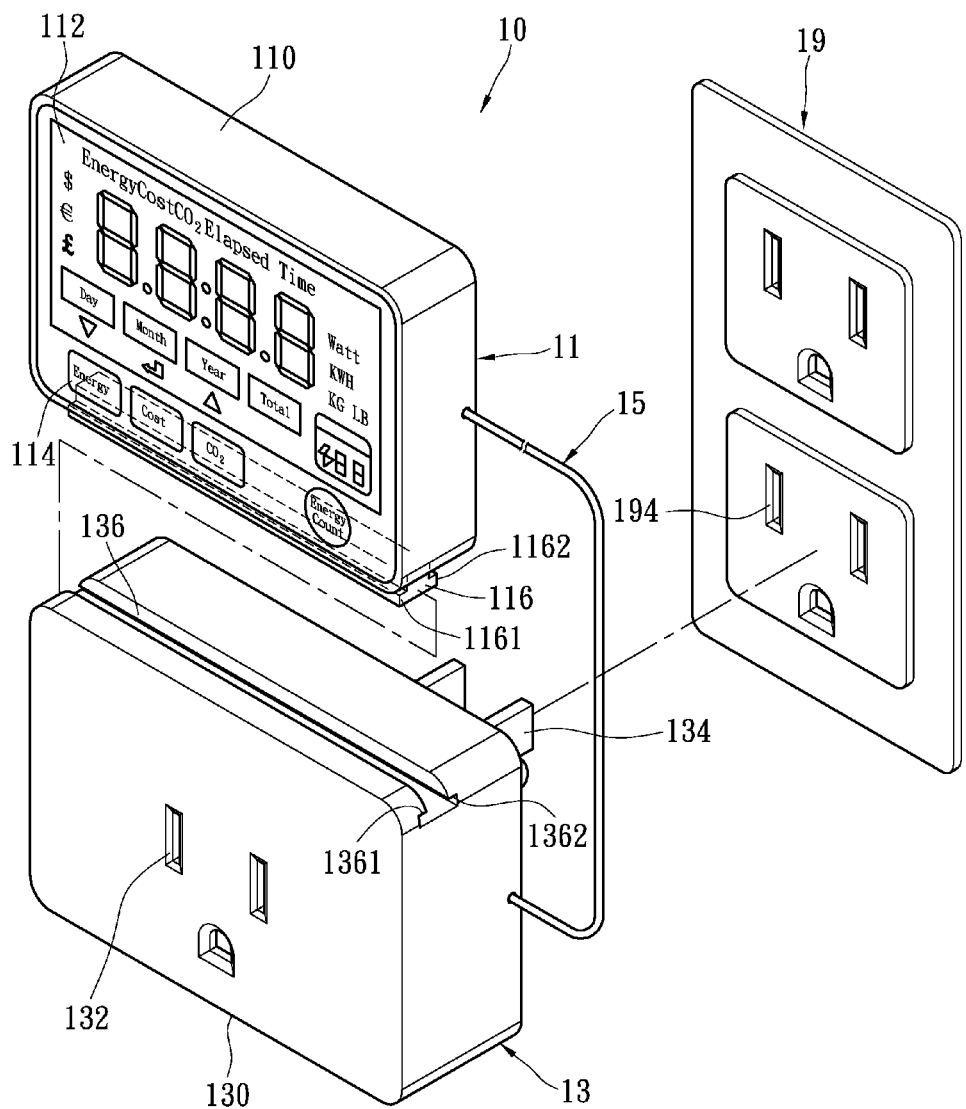
FIG. 1 shows a schematic diagram of an electric power information display receptacle module according to an embodiment of the present invention.

FIG. 1 shows a schematic diagram of an electric power information display receptacle module according to an embodiment of the present invention. As shown in FIG. 1, the electric power information display receptacle module 10 includes an electric power information display apparatus 11, an outlet apparatus 13, and a signal transmission line 15. The signal transmission line 15 has a first terminal and a second terminal coupled to the electric power information display apparatus 11 and the outlet apparatus 13 respectively.

The outlet apparatus 13 may be a wall plug, a socket adaptor, an extension cable socket, or other outlet apparatus, etc. This embodiment takes socket adaptor as an example, and the outlet apparatus 13 includes a casing 130, a power output interface 132, a power input interface 134, and a first connector 136. The power output interface 132 and the power input interface 134 are disposed on different lateral faces of the casing 130, and the power output interface 132 is coupled to the power input interface 134 through a power detecting circuit (not shown in the figure). The first connector 136 is disposed on the casing 130.

The electric power information display apparatus 11 includes a main body 110, a display unit 112, an input unit 114, and a second connector 116. The display unit 112, the input unit 114 and the second connector 116 are disposed on the main body 110.

The position of the first connector 136 disposed on the casing 130 is corresponds to the position of the second connector 116 disposed on the main body 110. The first connector 136 may be disposed on any lateral face of the casing 130; the second connector 116 may be disposed on any lateral face of the main body 110, for example: the first connector 136 is disposed on the top of the casing 130, and the second connector 116 is disposed on the bottom of the main body 110. Or the first connector 136 is disposed on the left section of the casing 130, and the second connector 116 is disposed on the right section of the main body 110. The first connector 136 may be plural, and be disposed on different lateral faces of the casing 130 respectively; users may connect the electric power information display apparatus 11 to different lateral faces of the outlet apparatus 13 according to the space constraint in reality.

The electric power information display apparatus 11 is detachably connected to the outlet apparatus 13 through the first connector 136 and the second connector 116, such as connecting with slide rail. As shown in FIG. 1, the first connector 136 has a first L-shaped slot 1361 and a second L-shaped slot 1362, and the second connector 116 has a first L-shaped slide 1161 and a second L-shaped slide 1162, the first L-shaped slide 1161 is slidingly engaged with the first L-shaped slot 1361 in a transverse direction, and the second L-shaped slide 1162 is slidingly engaged with the second L-shaped slot 1362 in the transverse direction. In other words, the first connector 136 may be a trench, and the second connector 116 may be a convex strip, and the cross-section of the convex strip is shaped to correspond to the cross-section of the trench, and the convex strip is slidingly engaged with the trench in transverse direction.

In one implementation, structure of the first connector 136 and the second connector 116 do not restricted thereto, these two are interchangeable in one implementation, i.e. the first connector 136 may be a convex strip, and the second connector 116 may be a trench.

The power output interface 132 of the outlet apparatus 13 may be two holes or three-holes alternating current socket, for providing a plug of the electrical device (not shown in the figure) to put in The power input interface 134 may be an alternating current socket and put in the inserting hole 194 of the wall socket 19 to obtain the electric power, and the power output interface 132 is used to provide the power to the electrical device. Accordingly, the electrical device obtains an electricity required for operation through the outlet apparatus 13. The outlet apparatus 13 may also include plural power output interfaces 132, and supply more than one electrical device to put in.

There is an electric detecting circuit installed in the outlet apparatus 13 (not shown in the figure). The electric detecting circuit is coupled between the power output interface 132 and the power input interface 134. The electric detecting circuit is used to detect the electric power passing through the power output interface 132 and the power input interface 134, such as the voltage, electric current or power. The electric detecting circuit obtains an electric power signal according detecting the electric power. The electric power signal relates to power consumption of the electrical device put in the power output interface 132. The electric detecting circuit may also detect power consumption of plural electrical devices simultaneously or separately.

There is a signal processing circuit installed in the electric power information display apparatus 11 (not shown in the figure), and the signal processing circuit is coupled to the signal transmission line 15, and receives the power signal through the signal transmission line 15. The signal processing circuit has a built-in firmware or software program, in order to executive the operation logic of the display function. The signal processing circuit may operate the electric power signal of the outlet apparatus 13, and control the display unit 112 to display the electric power information according to the electric power signal.

The input unit 114 may be plural entity keys or a touch screen type display for receiving the peripheral manipulation from users. The peripheral manipulation is that users press or touch different input unit 114 according to the electric power information which needs to be looked over, and referring to entity keys, or pattern or characters in the touch screen. If the input unit 114 is entity keys, it may be keys with composite function for realizing less number of keys and make the volume of the electric power information display apparatus 11 smaller.

The input unit 114 is coupled to the signal processing circuit for outputting an operating instruction to the signal processing circuit according to the peripheral manipulation. The signal processing circuit may operate on the electric power signal according to the operating instruction and controls the display unit 112 to display the electric power information corresponding to the operating instruction.

The operating instruction includes resetting, electric power counting, electric quantity, expense or carbon dioxide, etc., or may also be currency translation of expense, unit conversion of carbon dioxide and upper limit of the electric quantity etc. After operating through different conversion formula, the signal processing circuit may control by the display unit 112 to display the electric power information. The electric power information including real-time electricity, or accumulated electricity consumption summed up in annual, moon or day, and may also be an electricity expense that should be paid and the corresponding amount of carbon dioxide emission.

According to the structural design of the first connector 136 and the second connector of 116, user may union the electric power information display apparatus 11 and the outlet apparatus 13, therefore the detachable electric power information display receptacle module 10 may be regarded as a portable electric meter for immediately gathering the electric power information of the electrical device connected to the power output interface 132 such as present electricity consumption, and etc.

When users need to monitor the power consumption of the electrical device for a long time, he or she may separate the electric power information display apparatus 11 from the outlet apparatus 13 and put the electric power information display apparatus 11 in an easily observed place, for example, on the desk, on the cabinet, or set the electric power information display apparatus 11 on either wall or fixture with the viscose, in order to avoid inconvenience of bending over or squatting down to look over the electric power information.

In one implementation, the electric power information display apparatus 11 may have a foot rest located at a back of the main body 110 of itself, in order to make the electric power information display apparatus 11 may be put on the desk or on the cabinet firmly. A magnet may be set up on the back of the main body 110 of the electric power information display apparatus 11, in order to let the electric power information display apparatus 11 may adhere to a refrigerator or an iron cabinet steadily.

The outlet apparatus 13 of this embodiment takes the socket adaptor as an example, and any person who familiars with this skill could obtain the detachable electric power information display receptacle module made up with the wall socket and the electric power information display apparatus, after referring to this embodiment and making some alternations.

Another Embodiment

Figure 2:
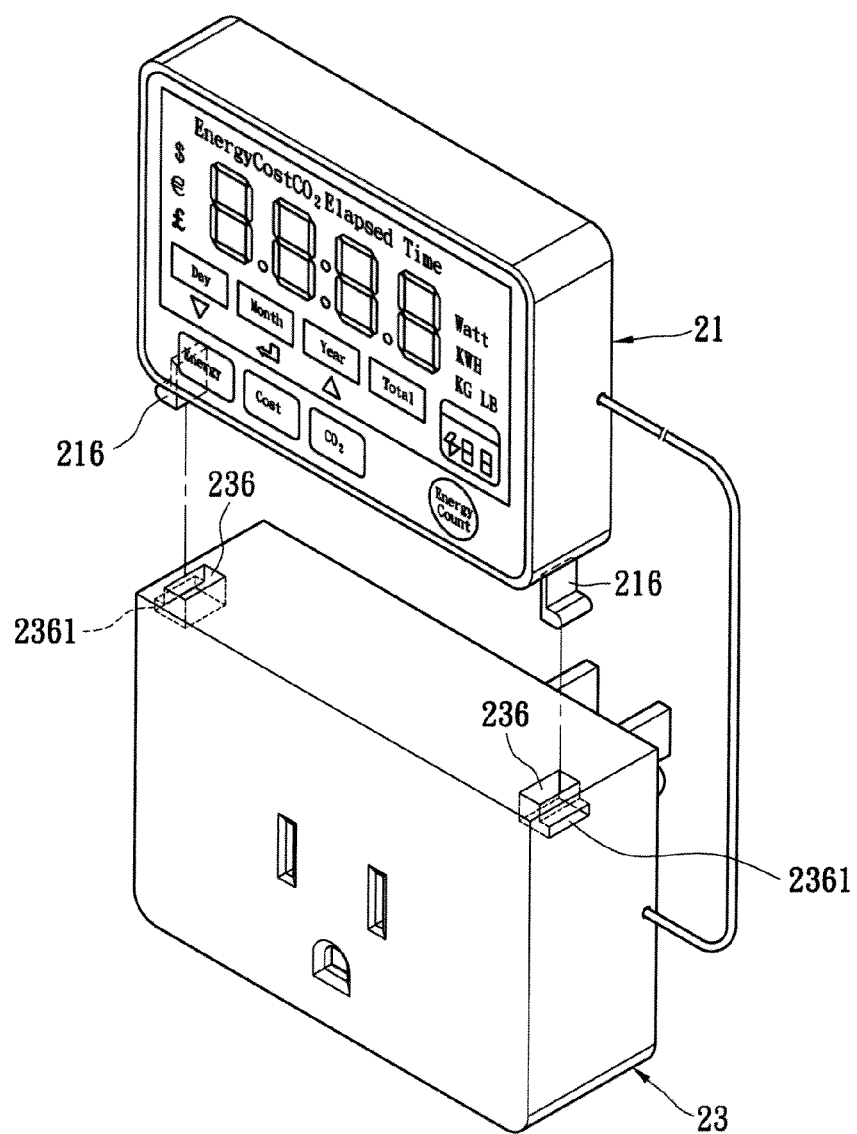
FIG. 2 shows a schematic diagram of an electric power information display receptacle module according to another embodiment of the present invention.

Please refer to FIG. 2, FIG. 2 shows a schematic diagram of an electric power information display receptacle module according to another embodiment of the present invention. As shown in FIG. 2, the electric power information display receptacle module 20 and the electric power information display receptacle module 10 are roughly the same. The difference between them is the electric power information display apparatus 21 and the outlet apparatus 23 are engaged in latch. The second connector 216 of the electric power information display apparatus 21 is two pieces of protrusion parts, and the first connector 236 of the outlet apparatus 23 is a containing part, the containing part is used to contain protrusion parts.

Two ends of the protrusion parts have a barb or a convex point separately, containing part has a location hole 2361 at the position relative to the barb or convex point, and the location hole 2361 may be an opening for positioning the barb or convex point. When users want to union the electric power information display apparatus 21 and the outlet apparatus 23, the end of the second connector 216 may be engaged with the location hole 2361 located on the first connector 236. When users want to detach and make the electric power information display apparatus 21 and the outlet apparatus 23 separately, he or she may press the first connector 236 exposed on the containing part, and then depart the second connector 216 from the containing part.

In one implementation, structure of the first connector 236 and the second connector 216 is not restricted thereto, these two are interchangeable, i.e. the first connector 236 may be a protrusion part, and the second connector 116 may be a containing part.

Another Embodiment

Figure 3:
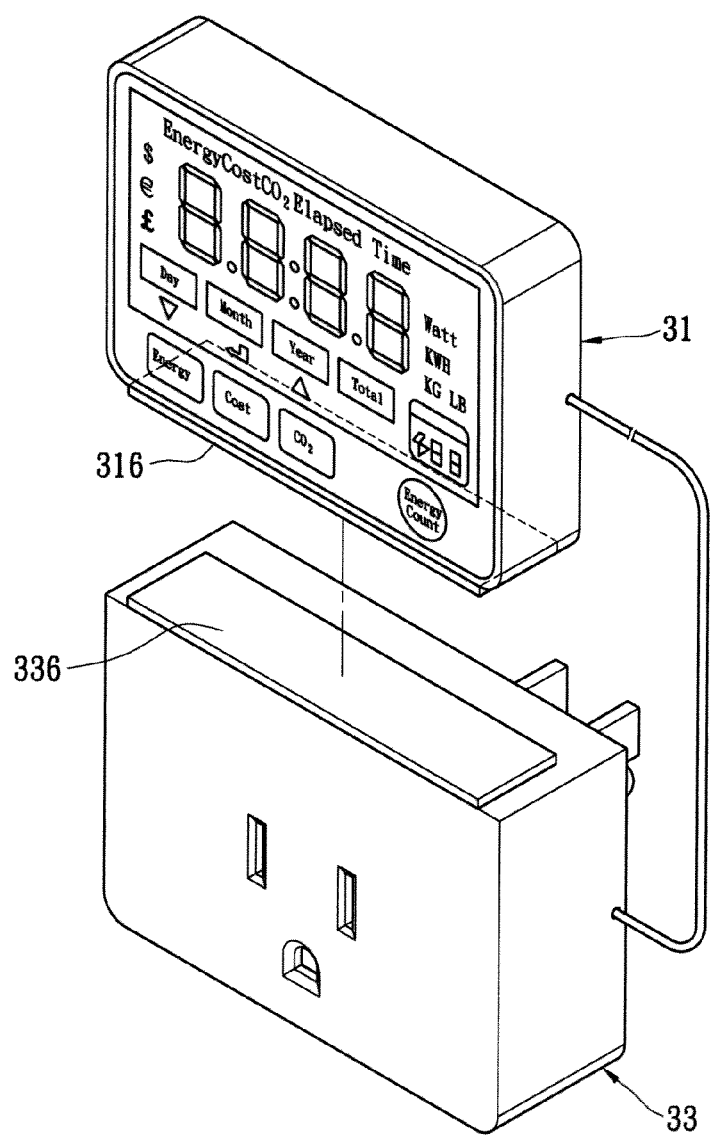
FIG. 3 shows a schematic diagram of an electric power information display receptacle module according to another embodiment of the present invention.

Please refer to FIG. 3, FIG. 3 shows a schematic diagram of an electric power information display receptacle module according to another embodiment of the present invention. As shown in FIG. 3, the detachable electric power information display receptacle module 30 and the electric power information display receptacle module 10 said in the first-mentioned embodiment are roughly the same. The difference between them is that the electric power information display apparatus 31 and the outlet apparatus 33 are connected via the magnetic force. The second connector 316 of the electric power information display apparatus 31 and the first connector 336 of the outlet apparatus 33 are magnetic elements which have unlike poles, alternatively, the second connector 316 is a magnetic element, and the first connector 336 is a metal component attracted to the second connector 316.

Another Embodiment

Figure 4:
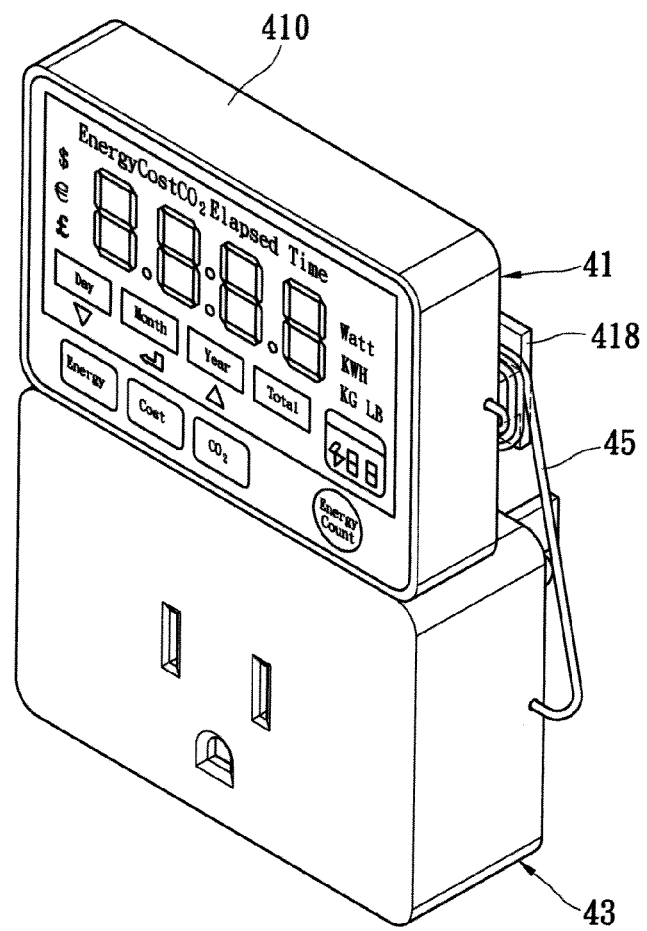
FIG. 4 shows a schematic diagram of an electric power information display receptacle module according to another embodiment of the present invention.

Please refer to FIG. 4, FIG. 4 shows a schematic diagram of an electric power information display receptacle module according to another embodiment of the present invention. As shown in FIG. 4, the detachable electric power information display receptacle module 40 and the aforementioned electric power information display receptacle module 10, 20, 30 in the first three-mentioned embodiments are roughly the same, it means that the electric power information display apparatus 41 may be connected to the outlet apparatus 43 through one kind of the first connector (not shown in the figure) and the second connector (not shown in the figure) which are disclosed in these three embodiments. The difference between them is that there is a winding frame 418 outside the body 410 of the electric power information display apparatus 41. No matter the outlet apparatus 43 is connected to or separated from the electric power information display apparatus 41, this winding frame 418 may be provided for winding the surplus of the signal transmission line 45. Accordingly, not only tangle of surplus of the signal transmission line 45 and other external objects may be prevented, but also neat and esthetic of the detachable electric power information display receptacle module 40 are maintained.

Another Embodiment

Figure 5:
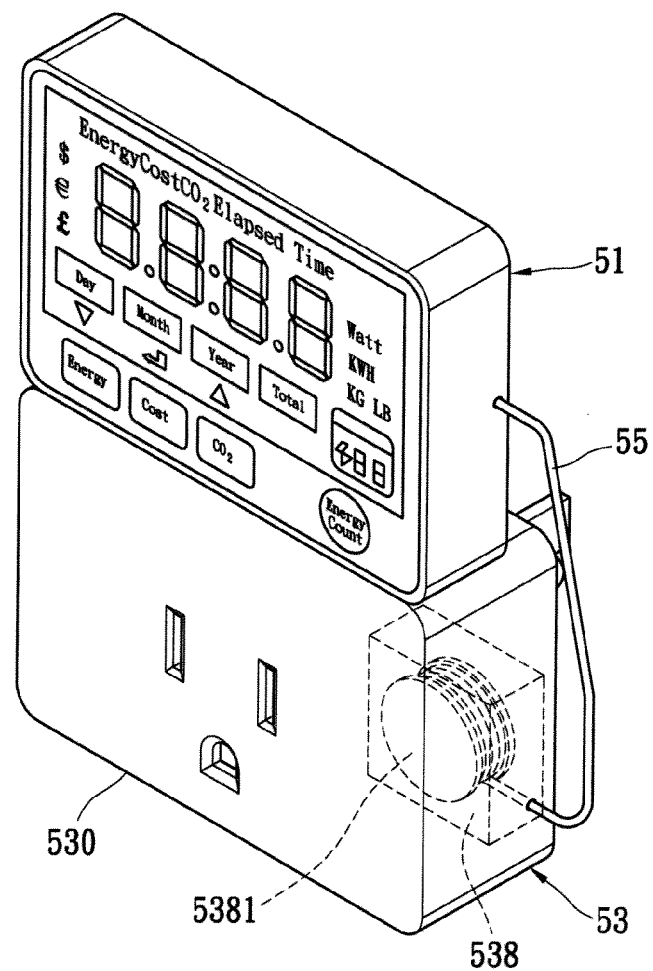
FIG. 5 shows a schematic diagram of an electric power information display receptacle module according to another embodiment of the present invention.

Please refer to FIG. 5, the figure shows a schematic diagram of an electric power information display receptacle module according to another embodiment of the present invention. As shown in FIG. 5, electric power information display receptacle module 50 and the aforementioned electric power information display receptacle module 10, 20, 30 in the first three-mentioned embodiments are roughly the same, it means that the electric power information display apparatus 51 may be connected to the outlet apparatus 53 through one kind of the first connector (not shown in the figure) and the second connector (not shown in the figure) which are disclosed in these three embodiments. The difference between them is that a storage tank 538 is installed in the casing 530. There is a cable winder 5381 installed in the storage tank 538. The cable winder 5381 is configured to pull the signal transmission line to be within the storage tank 538. Accordingly, not only tangle of surplus signal transmission line 55 and other external objects may be prevented, but also neat and esthetic of the detachable electric power information display receptacle module 50 are maintained.

In one implementation, the casing 530 may also be installed with the storage tank 538 alone, without having the cable winder 5381. And users may push the signal transmission line 55 to be within the storage tank 538 manually.

Another Embodiment

Figure 6A:
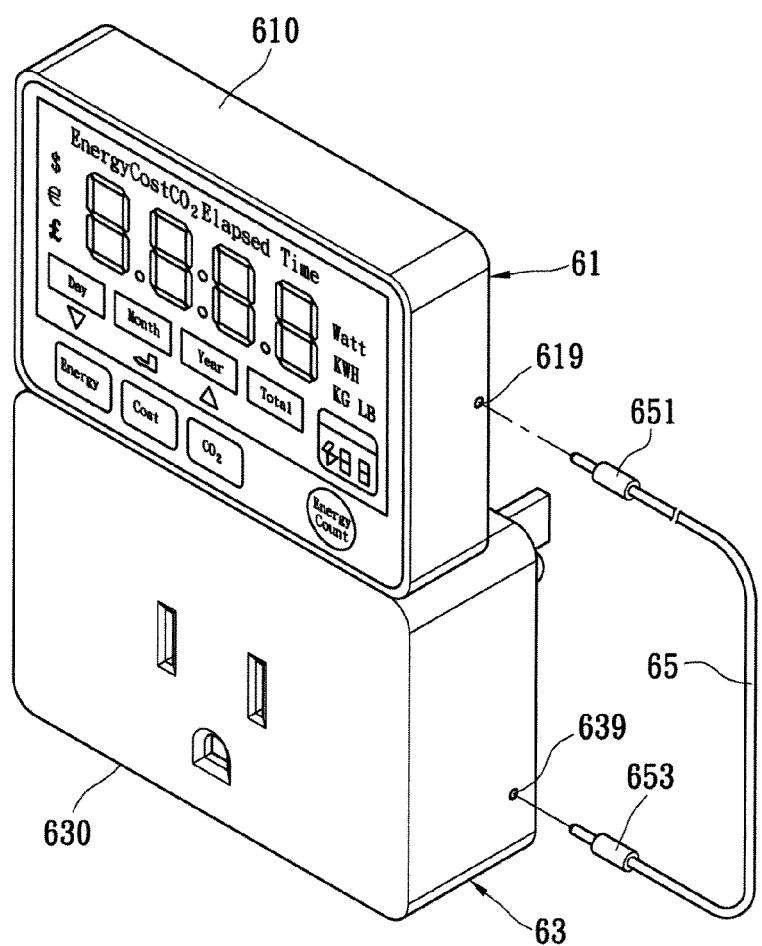
FIG. 6A and FIG. 6B show a schematic diagram of an electric power information display receptacle module according to another embodiment of the present invention.

Please refer to FIG. 6A, FIG. 6A shows a schematic diagram of an electric power information display receptacle module according to another embodiment of the present invention. As FIG. 6A shows, electric power information display receptacle module 50 and the aforementioned electric power information display receptacle module 10, 20, 30 in the first three-mentioned embodiments are roughly the same, it means that the electric power information display apparatus 51 may be connected to the outlet apparatus 53 through one kind of the first connector (not shown in the figure) and the second connector (not shown in the figure) which are disclosed in these three embodiments. The difference between them is that there is a first signal transmission interface 639 on the casing 630 of the outlet apparatus 63, and there is a second signal transmission interface 619 on the body 610 of the electric power information display apparatus 61. The signal transmission interface 65 has a first terminal and a second terminal. The first terminal and the second terminal of the signal transmission interface 65 have a first signal transmission port 651 and a second signal transmission port 653 respectively, and the first signal transmission port 651 and the second signal transmission port 653 is selectively plugged to the first signal transmission interface 639 or the second signal transmission interface 619.

The first signal transmission interface 639 is coupled to the electric detecting circuit (not shown in the figure), and the second signal transmission interface 619 is coupled to the signal processing circuit (not shown in the figure). The first signal transmission interface 639 and the second signal transmission interface 619 may be the interface of the universal serial bus (USB) or mother socket of other signal transmission interface respectively. The first signal transmission port 651 and the second signal transmission port 653 are male connectors whose specifications correspond to that of the first signal transmission interface 639 and the second signal transmission interface 619.

Accordingly, user may choose to connect the electric power message display apparatus 61 and the outlet apparatus 63 or not. When users not need to look over the electric power information, the outlet apparatus 63 and the electric power information display apparatus 61 may be connected physically and put in the wall plug at the same time, in order to prevent the electric power information display apparatus 61 from being lost. When users need to monitor the electricity expense displayed on the electric power information, users put the first signal transmission port 651 and the second signal transmission port 653 to the first signal transmission interface 639 or the second signal transmission interface 619 respectively. Therefore, the power consumption of the electric power information display apparatus 61 may be saved.

Figure 6B:
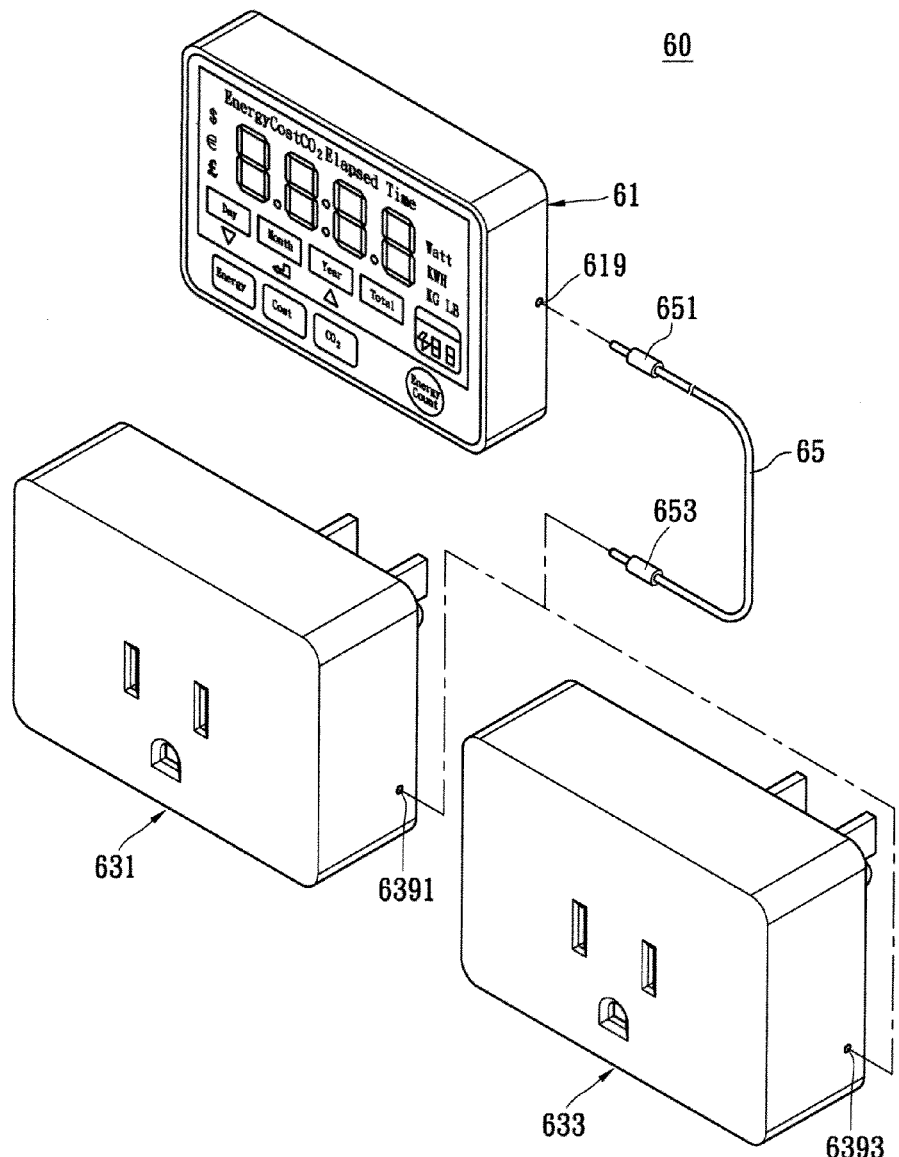

Please refer to FIG. 6B, users may use a plurality of outlet apparatus 631, 633 to collocate with an electric power information display apparatus 61. For example, when the first signal transmission port 651 put in the second signal transmission interface 619, the second signal transmission port 653 may be put in the first signal transmission interface 6391 of the outlet apparatus 631 or the first signal transmission interface 6393 of the outlet apparatus 633 selectively. So users may save the expense of buying a plurality of detachable electric power information display receptacle module 60.

Another Embodiment

Figure 7:
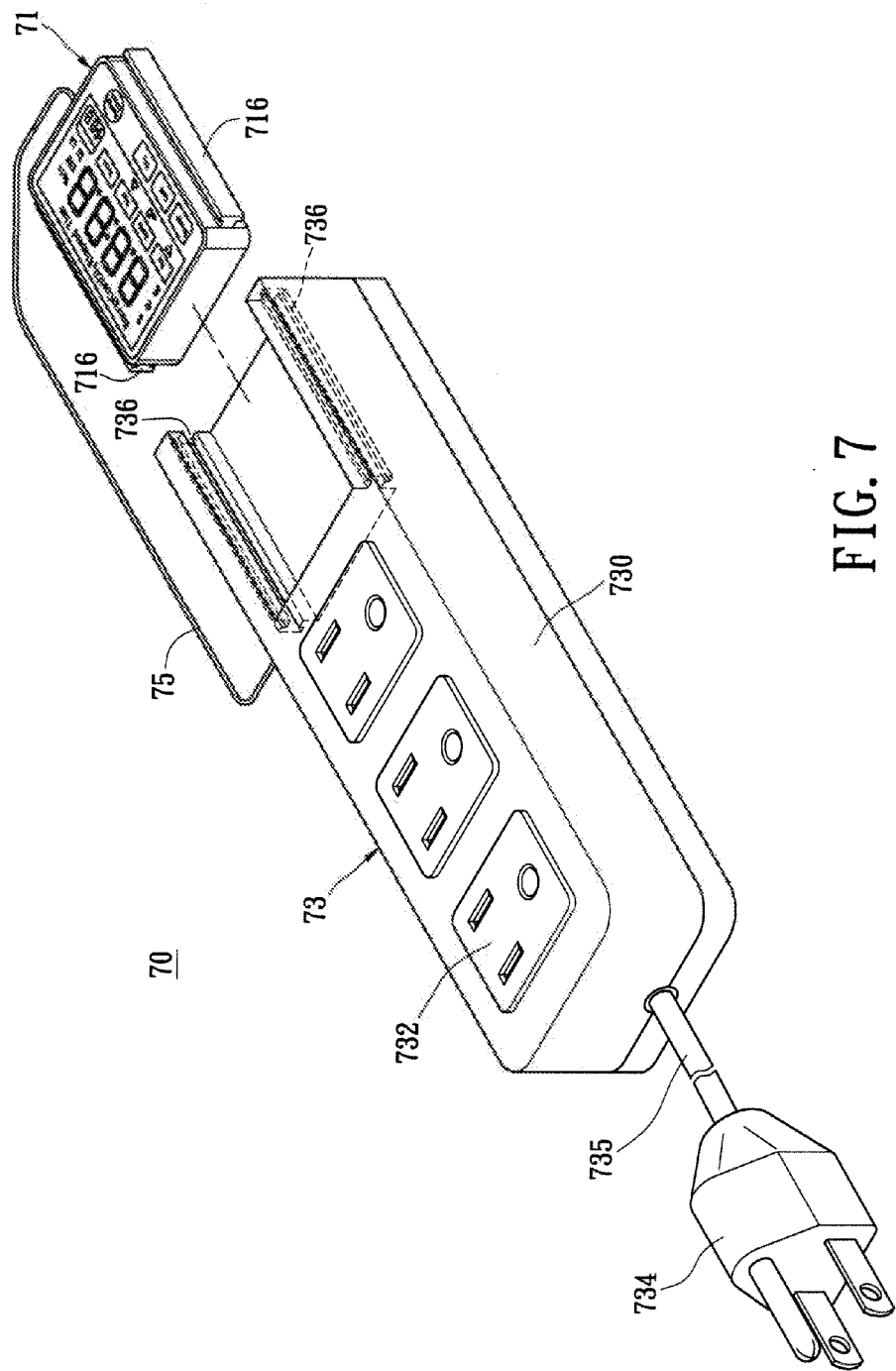
FIG. 7 shows a schematic diagram of an electric power information display receptacle module according to another embodiment of the present invention.

Please refer to FIG. 7, FIG. 7 shows a schematic diagram of an electric power information display receptacle module according to another embodiment of the present invention. As shown in FIG. 7, the electric power information display receptacle module 70 includes an electric power information display apparatus 71, an outlet apparatus 73 and a signal transmission line 75, and the first terminal and the second terminal of the signal transmission line 75 are coupled to the electric power information display apparatus 71 and outlet apparatus 73 respectively.

The outlet apparatus 73 in this embodiment takes an extension cable socket as an example, the outlet apparatus 73 includes a casing 730, a power line 735, a power input interface 734 and a power output interface 732. The power line 735 extends from inside of the casing 730 to out of the casing 730, and the power input interface 734 is coupled to the power line 735. The power output interface 732 is disposed on the casing 730.

There is an electric detecting circuit (not shown in the figure) installed in the outlet apparatus 73. The electric detecting circuit is coupled to the power output interface 732 and coupled to the power input interface 734 through the power line 735.

The electric power information display receptacle module 70 and the aforementioned electric power information display receptacle module 10, 20, or 30 in the first three-mentioned embodiments are roughly the same, except that the outlet apparatus 73 is the extension cable socket. Wherein the second connector 716 of the electric power information display apparatus 71 and the first connector 736 of the outlet apparatus may be detachably connected to each other through one kind of the method disclosed in these three embodiments.

In addition, the electric power information display receptacle module 70 may also utilize a containing structure such as the winding frame 418 or the cable winder 5381 said in the fourth-mentioned or the fifth-mentioned embodiment to store the signal transmission line 75.

The signal transmission line 75 of the electric power information display receptacle module 70 may also use the signal transmission line 65 in the sixth-mentioned embodiment, i.e. each of the first terminal and the second terminal of the signal transmission line 75 have a first signal transmission port (not shown in the figure) and a second signal transmission port (not shown in the figure) respectively. The first signal transmission port and the second signal transmission port are selectively coupled to the first signal transmission interface (not shown in the figure) of the outlet apparatus 73 or the second signal transmission interface (not shown in the figure) of the electric power information display apparatus 71 respectively.

Users may choose the outlet apparatus 63 said in the sixth-mentioned embodiment or the outlet apparatus 73 in this embodiment in accordance with usage of electricity actually. Users only needs to use an electric power information display apparatus 71 to collocate with the outlet apparatus 63 or 73 for monitoring the electric power information of electrical device put in the different outlet apparatus 63 or 73 at real-time.

Another Embodiment

Figure 8:
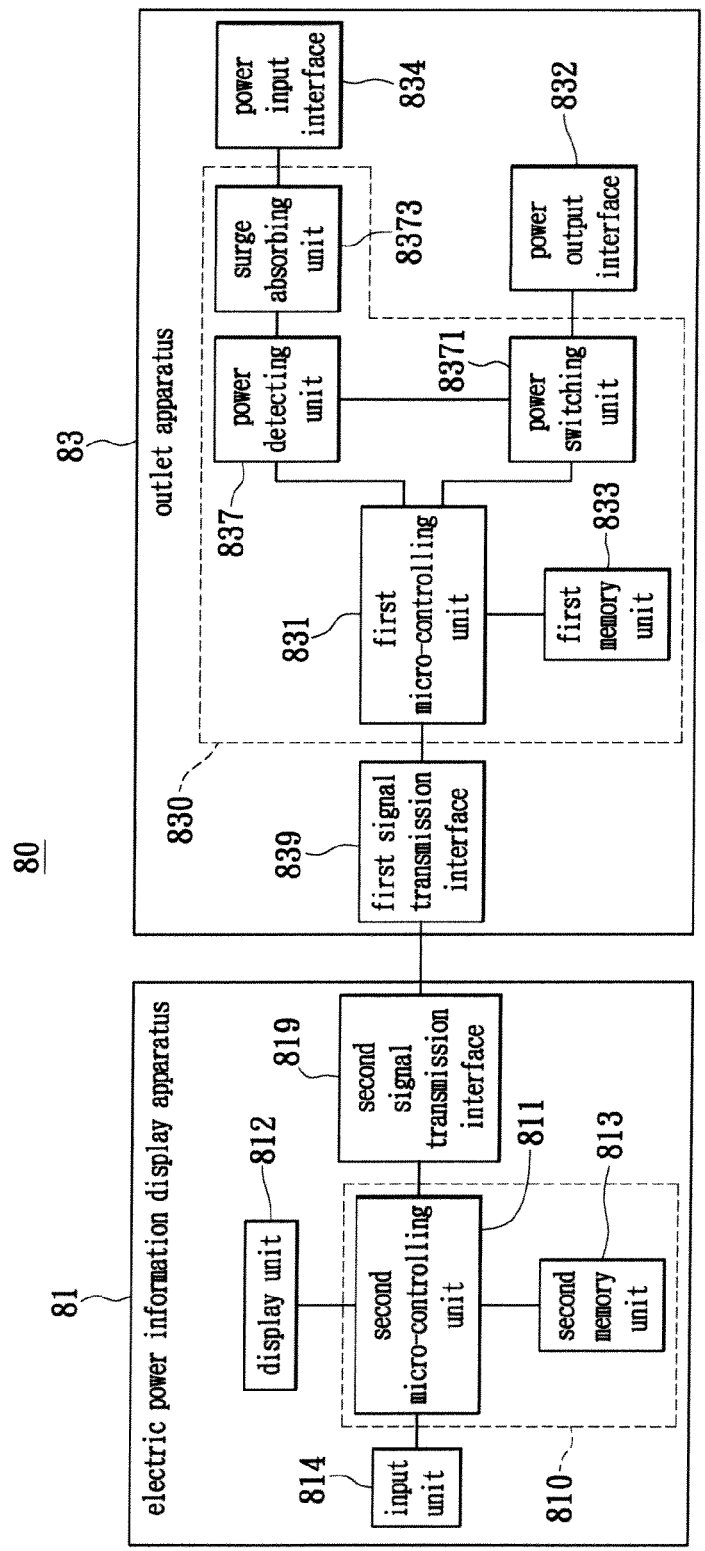
FIG. 8 shows a functional block diagram of an electric power information display receptacle module according to another embodiment of the present invention.

Please refer to FIG. 8, shows a functional block diagram of an electric power information display receptacle module according to another embodiment of the present invention. As shown in FIG. 8, the electric power information display receptacle module 80 includes an electric power information display apparatus 81 and an outlet apparatus 83. The outlet apparatus 83 may be an outlet apparatus such as a wall socket, a socket adaptor or an extension cable socket, etc.

The outlet apparatus 83 including an electric detecting circuit 830, a power output interface 832, a power input interface 834, and a first signal transmission interface 839. The power output interface 832, power input interface 834, and the first signal transmission interface 839 are coupled to the power detecting circuit 830 separately.

Electric power information display apparatus 81 including a signal processing circuit 810, a display unit 812, an input unit 814 and a second signal transmission interface 819. The display unit 812, the input unit 814, and the second signal transmission interface 819 are coupled to the signal processing circuit 810 separately.

The power detecting circuit 830 including a surge absorbing unit 8373, a power detecting unit 837, a power switching unit 8371, a first micro-controlling 831, and a first memory unit 833. The first micro-controlling 831 is coupled to the first signal transmission interface 839, a first memory unit 833, a power detecting unit 837, and a power switching unit 8371. The power detecting unit 837 is coupled to the surge absorbing unit 8373 and the power switching unit 8371. The surge absorbing unit 8373 is coupled to the power input interface 834.

First micro-controlling 831 may be coupled to the power input interface 834 through an AC to DC converter (not shown in the figure), in order to obtain the required DC power at the time of operation, and the first micro-controlling 831 may transmit the DC power to the second micro-controlling 811 through the first signal transmission interface 839, in order to obtain the required DC power when the second micro-controlling 811 is in operation.

The surge absorbing unit 8373 may provide a path to absorb the surge voltage or current when the power input interface 834 receives a surge. The power detecting unit 837 is configured to detect the electric power passing through the power input interface 834 and the power output interface 832, and obtain a detection signal according to detecting the electric power.

The first micro-controlling 831 may obtain the power signal after processing the quantization of the detection signal, and store the power signal in the first memory unit 833 temporarily. When the first signal transmission interface 839 is coupled to the second signal transmission interface 819, the power signal is transmitted to the electric power information display apparatus 81 through the first signal transmission interface 839.

The first micro-controlling 831 may judge whether the detection signal exceeds a preset threshold. When the detection signal exceeds the preset threshold, the first micro-controlling 831 controls the power switching unit 8371 to operate in an open circuit state, in order to turn off the conduction of the power input interface 834 and the power output interface 832. Accordingly, safety of the use of the electrical device may be increased.

The second micro-controlling 811 may receive the electric power signal through the second signal transmission interface 819, and store the electric power signal in the second memory unit 813. The second micro-controlling 811 may operate on the electric power signal according to the operating instruction of the input unit 814, and controls the input unit 814 to display the electric quantity, the electricity expense, and amount of carbon dioxide emissions related to the electric power information accordingly.

The electric power information display apparatus 81 may receive the upper limit about the electric quantity, the electricity expense and amount of carbon dioxide emissions set by users. When the second micro-controlling 811 finds the electric quantity, the electricity expense or amount of carbon dioxide emissions exceeding the upper limit, the second micro-controlling 811 controls the display unit 812 to display a warning pattern or alarm light, or controls a loudspeaker (not shown in the figure) to generate a caution sound.

In one implementation, the electric detecting circuit 830 may exclude the first micro-controlling 831, the power switching unit 8371 and the first memory unit 833, but the detecting unit 837 is coupled to the first signal transmission interface 839 and the power output interface 832. The power detecting circuit 831 outputs the detection signal of the power detecting unit 837 to the signal processing circuit 810 through the first signal transmission interface 839. Furthermore, the signal processing circuit 810 processes the quantization of the detection signal and turns the detection signal into the electric power signal, and controls the display unit 812 to display the electric power signal. Or the signal processing circuit 810 may operate on the electric power signal according to the operating instruction, in order to control the display unit 812 to display the electric power information such as electric quantity, an electricity expense and amount of carbon dioxide emissions.

According to all of the above, detachable electric power information display receptacle module of present invention may interlock with detachable structures, in order to obtain quickly connecting or separating of the electric power information display apparatus and the outlet apparatus. In connection status, the electric power information display receptacle module takes the role as a electric meter which is convenient to carry on, and provides users to look over the real-time electricity consumption; in separation status, the electric power information display apparatus may be put in a place which users may operate or look over easily without bending over or squatting down, and the capability of flexible use is attained accordingly.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A detachable electric power information display receptacle module, comprising:
    an outlet apparatus which is a socket adaptor having a casing, a power input interface, a power output interface, a power detecting circuit and a first connector, wherein the power input interface is disposed on the casing to receive an electric power, the power output interface is disposed on the casing to output the electric power, the power detecting circuit is installed in the casing and connected between the power input interface and the power output interface for detecting the electric power passing through the power input interface and the power output interface and obtaining a electric power signal according to detecting the electric power, and the first connector is disposed on the casing;
    a signal transmission line having a first terminal and a second terminal, wherein the first terminal is coupled to the power detecting circuit; and
    an electric power information display apparatus having a body, a display unit, a signal processing circuit and a second connector, wherein the display unit is disposed on the body, the signal processing circuit is coupled to the display unit and the second terminal of the signal transmission line for receiving the electric power signal through the signal transmission line and controlling the display unit to display an electric power information according to the electric power signal, the second connector is disposed on the body, and the electric power information display apparatus is detachably connected to the first connector of the outlet apparatus through the second connector, wherein regardless of whether or not the electric power information display apparatus is connected to the first connector of the outlet apparatus through the second connector, the electric power information display apparatus receives the electric power signal through the signal transmission line;
    wherein, the first connector has a first L-shaped slot and a second L-shaped slot, and the second connector has a first L-shaped slide and a second L-shaped slide, the first L-shaped slide is slidingly engaged with the first L-shaped slot in a transverse direction, and the second L-shaped slide is slidingly engaged with the second L-shaped slot in the transverse direction.

2. The detachable electric power information display receptacle module according to claim 1, wherein the first connector and the second connector are a containing part and a protrusion part, respectively, and the protrusion part is detachably engaged with the containing part.

3. The detachable electric power information display receptacle module according to claim 1, wherein the first connector and the second connector are magnetic elements having unlike poles, or a magnetic element and a metal component which is capable of attracting to the magnetic element.

4. The detachable electric power information display receptacle module according to claim 1, further comprising a winding frame disposed on the body, wherein the winding frame is for winding the signal transmission line.

5. The detachable electric power information display receptacle module according to claim 1, further comprising a storage tank installed in the casing, wherein the storage tank is configured to store the signal transmission line.

6. The detachable electric power information display receptacle module according to claim 1, further comprising a cable winder installed in the casing, wherein the cable winder is configured to pull the signal transmission line to be within the casing.

7. The detachable electric power information display receptacle module according to claim 1, wherein a foot rest or a magnet is located at a back of a main body of the electric power information display apparatus.

8. The detachable electric power information display receptacle module according to claim 1, wherein the outlet apparatus is a wall plug, a socket adaptor, or a power strip.

9. A detachable electric power information display receptacle module, including:
    an outlet apparatus, which is an extension cable socket, including a casing, a power line, a power input interface, a power output interface, a power detecting circuit, and a first connector, wherein the power line is extended from inside of the casing to outside of the casing, the power input interface is connected to the power line for receiving an electric power, the power output interface is disposed on the casing for outputting the electric power, the power detecting circuit is installed in the casing, coupled to the power output interface, and the power input interface through the power line for detecting the electric power passing through the power input interface and the power output interface, and obtaining an electric power signal according to detecting the electric power passing through the power input interface and the power output interface, and the first connector is disposed on the casing;
    a signal transmission line having a first terminal and a second terminal, wherein the first terminal is coupled to the power detecting circuit; and
    an electric power information display apparatus including a body, a display unit, a signal processing circuit and a second connector, wherein the display unit is disposed on the body, the signal processing circuit is coupled to the display unit and the second terminal of the signal transmission line, the signal processing circuit is configured to receive the electric power signal through the signal transmission line and control the display unit to display an electric power information according to the electric power signal, the second connector is disposed on the body, and the electric power information display apparatus is detachably connected to the first connector of the outlet apparatus through the second connector; wherein, the first connector has a first L-shaped slot and a second L-shaped slot, and the second connector has a first L-shaped slide and a second L-shaped slide, the first L-shaped slide is slidingly engaged with the first L-shaped slot in a transverse direction, and the second L-shaped slide is slidingly engaged with the second L-shaped slot in the transverse direction.

10. The detachable electric power information display receptacle module according to claim 9, wherein the first connector and the second connector are a trench and a convex strip, respectively, and a cross-section of the convex strip is shaped to correspond to a cross-section of the trench, and the convex strip is slidingly engaged with the trench.

11. The detachable electric power information display receptacle module according to claim 9, wherein the first connector and the second connector are a containing part and a protrusion part, respectively, and the protrusion part is detachably engaged with the containing part.

12. The detachable electric power information display receptacle module according to claim 9, wherein the first connector and the second connector are magnetic elements having unlike poles, respectively, or a magnetic element and a metal unit which is capable of attracting to the magnetic element.

13. The detachable electric power information display receptacle module according to claim 9, further including a winding frame disposed on the body, wherein the winding frame is for winding the signal transmission line.

14. The detachable electric power information display receptacle module according to claim 9, further including a storage tank installed in the casing, and the storage tank is configured to store the signal transmission line.

15. The detachable electric power information display receptacle module according to claim 9, further including a cable winder installed in the casing, and the cable winder is configured to pull the signal transmission line to be within the casing.

16. The detachable electric power information display receptacle module according to claim 9, wherein the outlet apparatus further includes a first signal transmission interface disposed on the casing and coupled to the power detecting circuit, the electric power information display apparatus further includes a second signal transmission interface disposed on the body and coupled to the signal processing circuit, the first terminal and the second terminal of the signal transmission interface have a first signal transmission port and a second signal transmission port, respectively, and the first signal transmission port and the second signal transmission port are selectively plugged to the first signal transmission interface or the second signal transmission interface.

\* \* \* \* \*